(12) United States Patent
Lee

(10) Patent No.: US 11,569,179 B2
(45) Date of Patent: Jan. 31, 2023

(54) PACKAGE STRUCTURE INCLUDING AN OUTER LEAD PORTION AND AN INNER LEAD PORTION AND METHOD FOR MANUFACTURING PACKAGE STRUCTURE

(71) Applicant: Advanced Semiconductor Engineering, Inc., Kaohsiung (TW)

(72) Inventor: Yu-Ying Lee, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/953,255

(22) Filed: Nov. 19, 2020

(65) Prior Publication Data
US 2022/0157742 A1    May 19, 2022

(51) Int. Cl.
| H01L 23/00 | (2006.01) |
| H01L 23/31 | (2006.01) |
| H01L 23/495 | (2006.01) |
| H01L 21/56 | (2006.01) |
| H01L 21/48 | (2006.01) |

(52) U.S. Cl.
CPC ........ *H01L 23/562* (2013.01); *H01L 21/4825* (2013.01); *H01L 21/4828* (2013.01); *H01L 21/565* (2013.01); *H01L 23/3114* (2013.01); *H01L 23/4952* (2013.01); *H01L 23/49513* (2013.01); *H01L 23/49548* (2013.01)

(58) Field of Classification Search
CPC ... H01L 23/14; H01L 23/562; H01L 23/3114; H01L 23/4952; H01L 23/49548; H01L 21/4825; H01L 21/4828; H01L 21/565; H01L 2224/13116; H01L 2224/13616

USPC .......................................................... 257/669
See application file for complete search history.

(56) References Cited

U.S. PATENT DOCUMENTS 6,642,609 B1 * 11/2003 Minamio ............ H01L 21/6835
  257/676
7,411,289 B1 *  8/2008 McLellan ......... H01L 23/49548
  257/676

(Continued)

FOREIGN PATENT DOCUMENTS

JP    5-90475    * 4/1993 ............. H01L 23/50

OTHER PUBLICATIONS

U.S. Appl. No. 16/442,286, filed Jun. 14, 2019, Chen et al.
U.S. Appl. No. 16/929,018, filed Jul. 14, 2020, Huang et al.

*Primary Examiner* — Khiem D Nguyen
(74) *Attorney, Agent, or Firm* — Foley & Lardner LLP

(57) ABSTRACT

A semiconductor package structure and a method for manufacturing a semiconductor package structure are provided. The package structure includes an outer lead portion, an inner lead portion, an encapsulant, and a first conductive layer. The outer lead portion has a first surface and a second surface opposite to the first surface. The inner lead portion is connected to the outer lead portion. The inner lead portion has a first surface and a second surface opposite to the first surface. The encapsulant covers the first surface of the outer lead portion and the first surface of the inner lead portion. The second surface of the outer lead portion and the second surface of the inner lead portion are substantially coplanar and are recessed from a surface of the encapsulant. The first conductive layer is disposed on the second surface of the outer lead portion.

18 Claims, 14 Drawing Sheets

(56) References Cited

U.S. PATENT DOCUMENTS

| | | | | |
|---|---|---|---|---|
| 8,053,872 B1* | 11/2011 | Swan | ................ | C25D 5/12 |
| | | | | 257/659 |
| 8,106,492 B2* | 1/2012 | Chang Chien | ........ | H01L 21/565 |
| | | | | 257/784 |
| 9,570,381 B2* | 2/2017 | Lu | ................ | H01L 21/4825 |
| 10,903,172 B2* | 1/2021 | Cadag | ................ | H01L 23/3114 |
| 2003/0006055 A1* | 1/2003 | Chien-Hung | ..... | H01L 23/49548 |
| | | | | 174/557 |
| 2006/0035414 A1* | 2/2006 | Park | ................ | H01L 24/97 |
| | | | | 438/123 |
| 2009/0230523 A1* | 9/2009 | Chien | ................ | H01L 21/4832 |
| | | | | 257/676 |
| 2011/0140252 A1* | 6/2011 | Camacho | ................ | H01L 24/48 |
| | | | | 257/676 |
| 2013/0001761 A1* | 1/2013 | Rogren | ............ | H01L 23/49582 |
| | | | | 257/676 |
| 2016/0293531 A1* | 10/2016 | Lu | ................ | H01L 21/4828 |
| 2020/0098672 A1* | 3/2020 | Hayashi | ............ | H01L 23/49541 |

* cited by examiner

FIG. 2A

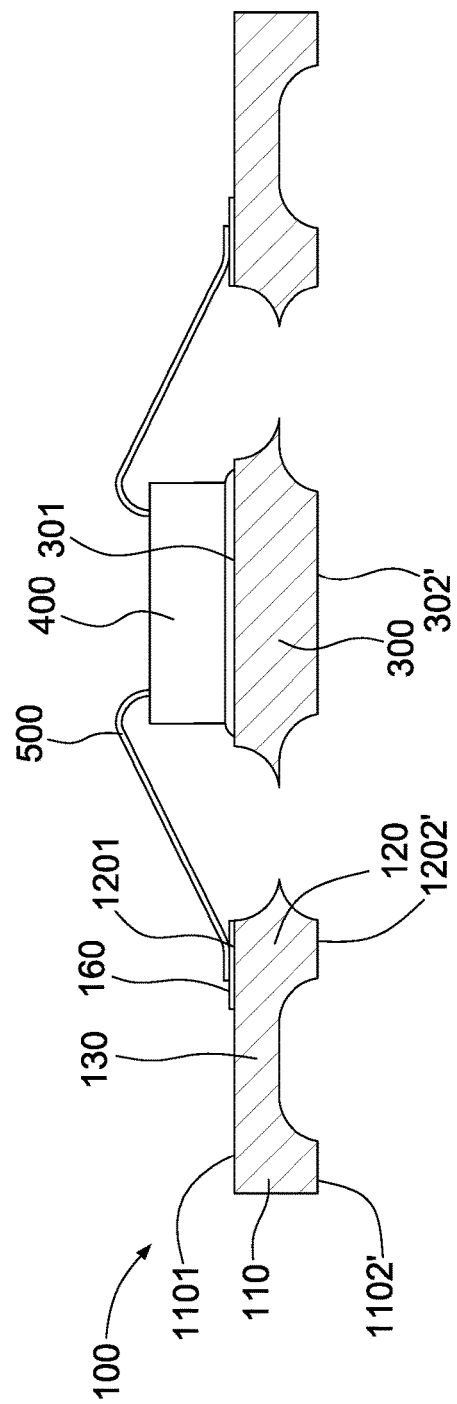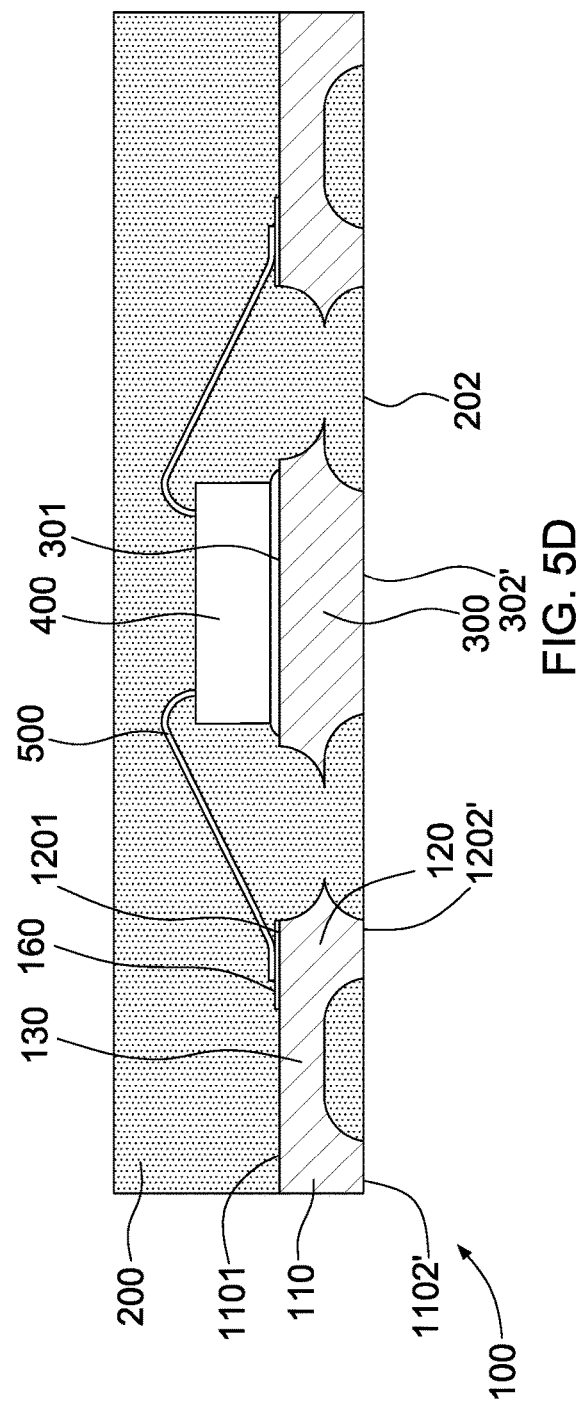

US 11,569,179 B2

PACKAGE STRUCTURE INCLUDING AN OUTER LEAD PORTION AND AN INNER LEAD PORTION AND METHOD FOR MANUFACTURING PACKAGE STRUCTURE

BACKGROUND

1. Technical Field

The present disclosure relates generally to a package structure, an electronic device and a method for manufacturing a package structure.

2. Description of the Related Art

Quad flat non-lead packages (QFN) are widely used for IC packaging and IC assemblies. Generally, the longer the length of the leads the better since the total length of the bonding wires can be reduced by taking the advantage of the longer leads. The longer leads (e.g., with a length greater than about 2 mm) usually undergo a half etch operation in order to reduce the thickness of each of the leads so as to prevent the leads from exposing from the molding compound subsequently encapsulating the IC package or IC assembly.

SUMMARY

In one or more embodiments, a package structure includes an outer lead portion, an inner lead portion, an encapsulant, and a first conductive layer. The outer lead portion has a first surface and a second surface opposite to the first surface. The inner lead portion is connected to the outer lead portion. The inner lead portion has a first surface and a second surface opposite to the first surface. The encapsulant covers the first surface of the outer lead portion and the first surface of the inner lead portion. The second surface of the outer lead portion and the second surface of the inner lead portion are substantially coplanar and are recessed from a surface of the encapsulant. The first conductive layer is disposed on the second surface of the outer lead portion.

In one or more embodiments, an electronic device includes a substrate, a package structure, and a plurality of conductive bumps. The package structure includes an outer lead portion, an inner lead portion, an encapsulant, and a first conductive layer. The inner lead portion is connected to the outer lead portion. The inner lead portion has a first surface and a second surface opposite to the first surface. The encapsulant covers the outer lead portion and the inner lead portion. A surface of the outer lead portion and a surface of the inner lead portion are recessed from a surface of the encapsulant. The first conductive layer is disposed on the surface of the outer lead portion. The bumps are disposed between the substrate and the package structure. The first conductive layer is in contact with at least one of the conductive bumps and form an electrical connection between the substrate and the package structure.

In one or more embodiments, a method for manufacturing a package structure includes the following operations: providing a lead frame comprising an outer lead portion and an inner lead portion connected to the outer lead portion; encapsulating the outer lead portion and the inner lead portion by an encapsulant; and etching a surface of the outer lead portion and a surface of the inner lead portion in a single operation, so as to form an etched surface of the outer lead portion and an etched surface of the inner lead portion that are recessed from a surface of the encapsulant.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 2A illustrates a cross-sectional view of a package structure in accordance with some embodiments of the present disclosure;

FIG. 5A, FIG. 5B, FIG. 5C, FIG. 5D, FIG. 5E, FIG. 5F, FIG. 5G and FIG. 5H illustrate various operations in a method of manufacturing a package structure in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Longer leads with reduced thicknesses are preferred in QFNs, so that the total length of the bonding wires may be reduced and the leads may be prevented from exposing from the molding compounds. The thinned longer leads are prone to deform during the wire bonding operation by virtue of lack of mechanical strength and support. In conventional approaches, a mesa kit is adopted to support the portion of the lead receiving the wire bond during the wire bonding operation. However, because the half-etch operation and mesa kit both possess dimensional tolerance, that is, each of the leads may be etched by different amount, and each mesa kit may possess different thicknesses, dimensional mismatch may occur between each pair of the half-etched lead and the mesa kit, deteriorating the workability of the wire bonding operation. In addition, thermal stress and mold flow can further affect the longer lead which inherently being mechanically weak, thereby causing serious deformation or even the exposure of the longer leads from the encapsulant.

In some embodiments of the present disclosure, back surfaces of an outer lead portion and an inner lead portion of a lead frame are substantially leveled, providing better mechanical support by the body of the inner lead portion during wire bonding operation and such structure facilitates the processing of the package structure implementing the lead frame described herein.

Figure 1A:
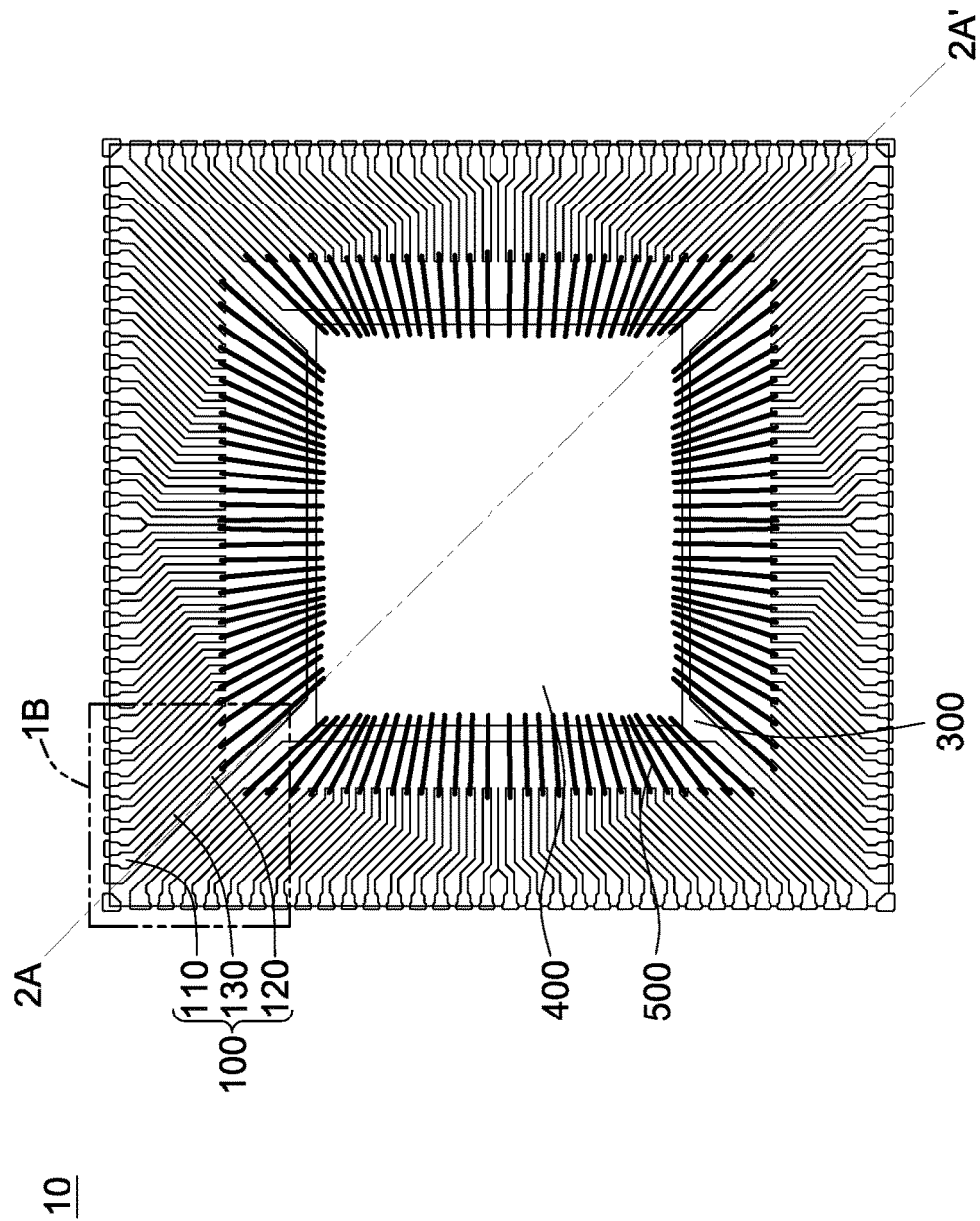
FIG. 1A illustrates a top view of a package structure in accordance with some embodiments of the present disclosure.
Figure 1B:
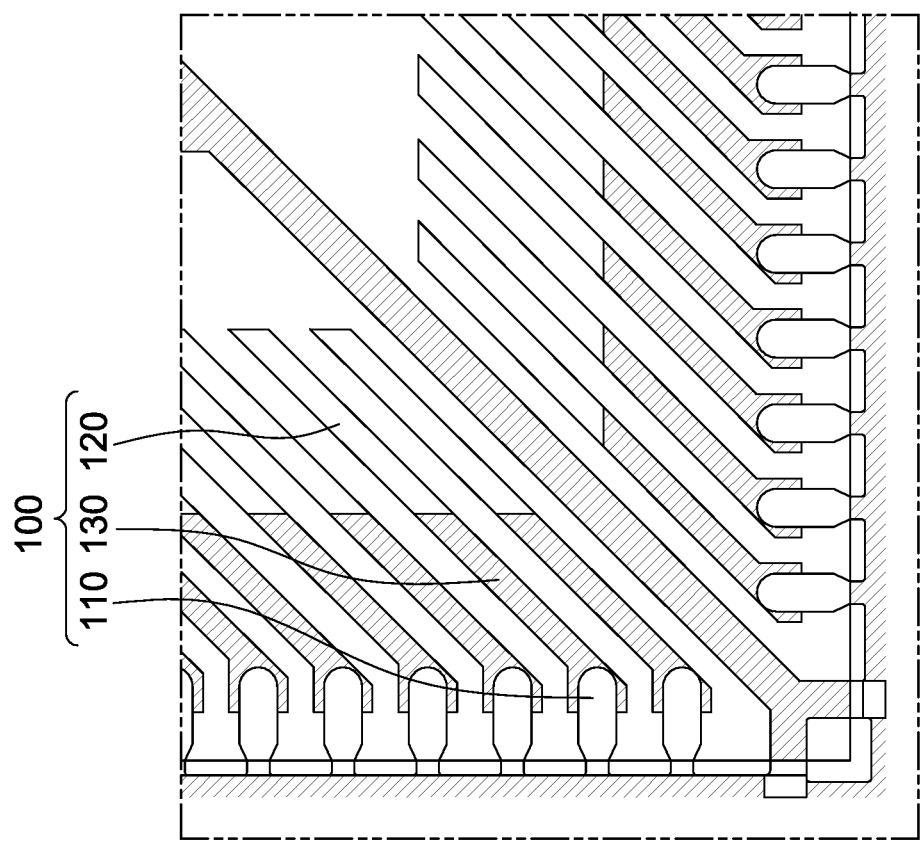
FIG. 1B illustrates an enlarged bottom view of a portion of a package structure in accordance with some embodiments of the present disclosure.

FIG. 1A illustrates a top view of a package structure 10 in accordance with some embodiments of the present disclosure, and FIG. 1B illustrates an enlarged bottom view of a portion of a package structure 10 in accordance with some embodiments of the present disclosure. The package structure 10 includes one or more lead frames 100, a die paddle 300, a semiconductor die 400, and one or more bonding wires 500.

In some embodiments, each of the lead frame 100 includes an outer lead portion 110, an inner lead portion 120, and a bridge portion 130. In some embodiments, the inner lead portion 120 is connected to the outer lead portion 110. In some embodiments, each of the outer lead portion 110, the inner lead portion 120, and the bridge portion 130 may be or include a conductive material such as a metal or metal alloy. Examples include gold (Au), silver (Ag), aluminum (Al), copper (Cu), or an alloy thereof.

In some embodiments, the outer lead portion 110 and the inner lead portion 120 are formed integrally as a monolithic structure. In some embodiments, the bridge portion 130 connects the outer lead portion 110 and the inner lead portion 120. In some embodiments, the outer lead portion 110, the inner lead portion 120, and the bridge portion 130 are formed integrally as a monolithic structure. In some embodiments, the outer lead portion 110, the inner lead portion 120, and the bridge portion 130 are made of or include copper (Cu).

In some embodiments, the die paddle 300 is spaced apart from the inner lead portion 120. In some embodiments, the semiconductor die 400 is disposed on the die paddle 300. In some embodiments, the bonding wire 500 connects the semiconductor die 400 and the inner lead portion 120. In some embodiments, the bonding wire 500 may be or include gold (Au), copper (Cu), or a combination thereof.

Figure 2A:
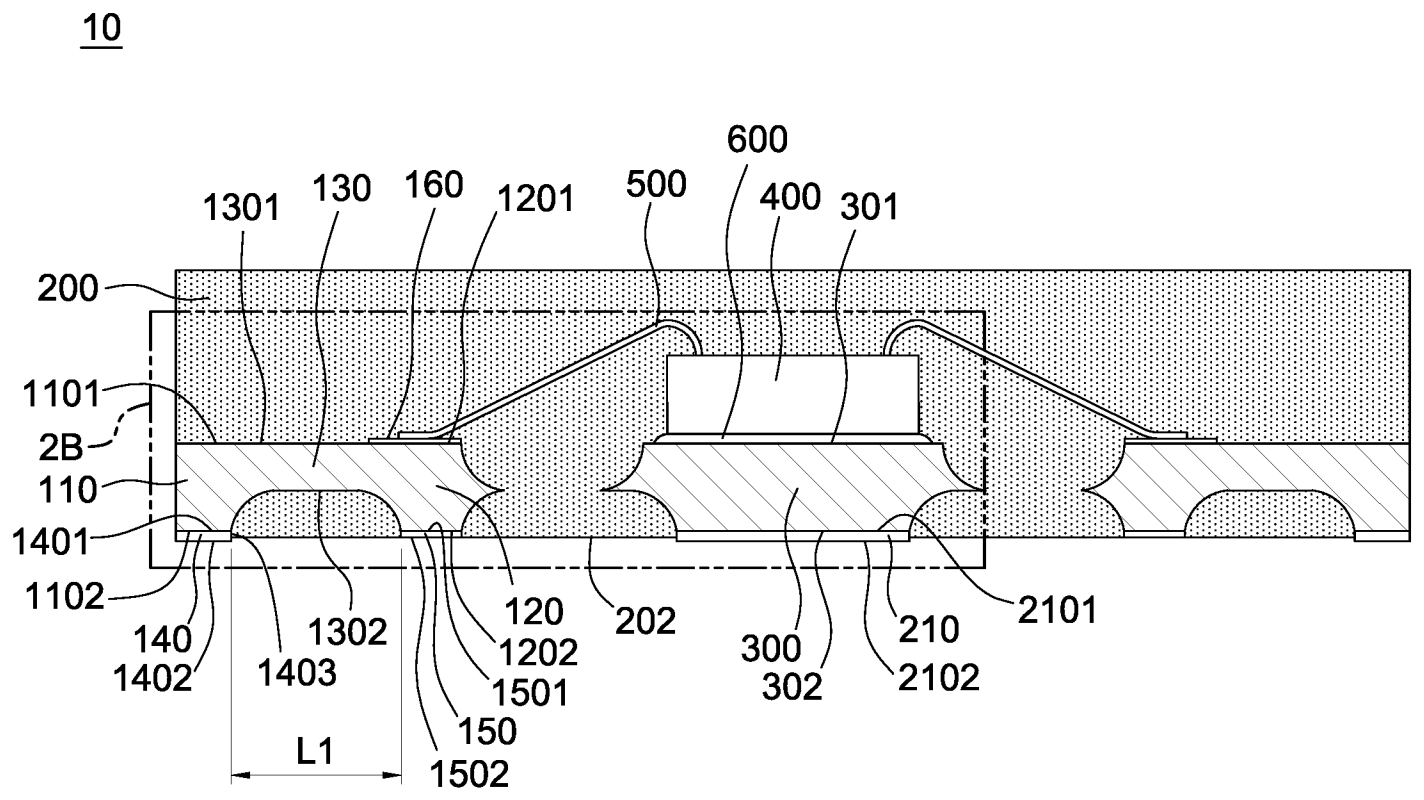

FIG. 2A illustrates a cross-sectional view of a package structure 10 in accordance with some embodiments of the present disclosure. In some embodiments, FIG. 2A may illustrate a cross-sectional view along the cross-sectional line 2A-2A' in FIG. 1A.

In some embodiments, the package structure 10 includes an outer lead portion 110, an inner lead portion 120, a bridge portion 130, an encapsulant 200, conductive layers 140 and 210, an insulating coating layer 150, a conductive pad 160, a die paddle 300, a semiconductor die 400, one or more bonding wires 500, and an adhesive layer 600.

In some embodiments, the outer lead portion 110 has a surface 1101 and a surface 1102 opposite to the surface 1101. In some embodiments, the external surface (including the surface 1101 and the 1102) of the outer lead portion 110 is free from disposing a conductive coating layer thereon. In some embodiments, the conductive coating layer may be a metal finish layer or an etch stop layer. The metal finish layer or the etch stop layer may be or include a pre-plating frame finish (PPF) or a Ni/Pd/Au composite layer. The outer lead portion 110 may serve to electrically connect to I/O terminals.

In some embodiments, the inner lead portion 120 has a surface 1201 and a surface 1202 opposite to the surface 1201. In some embodiments, the surface 1201 of the inner lead portion 120 may be connected to the bonding wire 500. In some embodiments, the surface 1102 of the outer lead portion 110 and the surface 1202 of the inner lead portion 120 are substantially coplanar. In some embodiments, the inner lead portion 120 is an integral structure. In some embodiments, the inner lead portion 120 is formed integrally as a monolithic structure. In some embodiments, the inner lead portion 120 is formed of a homogenous material composition. In some embodiments, the inner portion 120 is made of or includes copper (Cu). In some embodiments, the surface 1102 of the outer lead portion 110 and the surface 1202 of the inner lead portion 120 may contact a table of a wire bonding machine during a wire bonding process. In some embodiments, the external surface (including the surface 1201 and the 1202) of the inner lead portion 120 is free from disposing a conductive coating layer thereon. In some embodiments, the conductive coating layer may be a metal finish layer or an etch stop layer. The metal finish layer or the etch stop layer may be or include a pre-plating frame finish (PPF) or a Ni/Pd/Au composite layer.

In some embodiments, the bridge portion 130 connects the inner lead portion 120 to the outer lead portion 110. In some embodiments, the bridge portion 130 has a surface 1301 and a surface 1302 opposite to the surface 1301. In some embodiments, the surface 1301 of the bridge portion 130 is substantially coplanar with the surface 1201 of the inner lead portion 120 and/or the surface 1101 of the outer lead portion 110. In some embodiments, the surface 1302 of the bridge portion 130 is recessed from the surface 1102 of the outer lead portion 110. In some embodiments, the surface 1302 of the bridge portion 130 is recessed from the surface 1202 of the inner lead portion 120. In some embodiments, a length L1 of the bridge portion 130 is greater than about 2 mm, about 4 mm, or about 7 mm. In some embodiments, the inner lead portion 120 and the bridge portion 130 are formed integrally as a monolithic structure. In some embodiments, the inner lead portion 120 and the bridge portion 130 are formed of a homogenous material composition. In some embodiments, the inner portion 120 and the bridge portion 130 are made of or include copper (Cu). In some embodiments, the external surface (including the surface 1301 and the 1302) of the bridge portion 130 is free from disposing a conductive coating layer thereon. In some embodiments, the conductive coating layer may be a metal finish layer or an etch stop layer. The metal finish layer or the etch stop layer may by or include a pre-plating frame finish (PPF) or a Ni/Pd/Au composite layer.

According to some embodiments of the present disclosure, the surface 1202 of the inner lead portion 120 being substantially coplanar with the surface 1102 of the outer lead portion 110 can provide sufficient support to the wire-bonding region of the inner lead portion 120 and increase the structural strength of the lead frame 100, and thus the bridge portion 130 can be prevented from shaking or deforming during the wire bonding process, such that the workability of the wire bonding process can be improved. Therefore, the length L1 of the bridge portion 130 can be formed relatively long without reducing the reliability of the lead frame 100, and the length of the bonding wire 500 may be formed relatively short so as to reduce the manufacturing cost and increase the yield of the wire bonding process.

In addition, according to some embodiments of the present disclosure, the inner lead portion 120 is formed integrally as a monolithic structure, such that the inner lead portion 120 can be prevented from deformation, delamination, or undesirable change in its thickness caused by stress between heterogeneous materials of different parts, and thus the workability of the wire bonding process can be further improved.

In some embodiments, the encapsulant 200 covers the surface 1101 of the outer lead portion 110 and the surface 1201 of the inner lead portion 120. In some embodiments, the encapsulant 200 directly contacts the surface 1101 of the outer lead portion 110 and the surface 1201 of the inner lead portion 120. In some embodiments, the surface 1102 of the outer lead portion 110 and the surface 1202 of the inner lead portion 120 are recessed from a surface 202 of the encapsulant 200. In some embodiments, the surface 1301 and the surface 1302 of the bridge portion 130 are covered by the encapsulant 200.

In some embodiments, the conductive pad 160 is disposed on the inner lead portion 120. In some embodiments, the conductive pad 160 directly contacts the bonding wire 500 and the inner lead portion 120. In some embodiments, the conductive pad 160 directly contacts the surface 1201 of the inner lead portion 120. In some embodiments, the conductive pad 160 directly contacts the encapsulant 200. In some embodiments, the conductive pad 160 may be or includes a conductive material such as a metal or metal alloy. Examples include gold (Au), silver (Ag), aluminum (Al), copper (Cu), or an alloy thereof. In some embodiments, the conductive pad 160 is or includes a silver (Ag) layer.

According to some embodiments of the present disclosure, the surface 1102 of the outer lead portion 110 and the surface 1202 of the inner lead portion 120 are recessed from the surface 202 of the encapsulant 200, and thus the recess defined by the surface 1102 and the encapsulant 200 and the recess defined by the surface 1202 and the encapsulant 200 can be respectively disposed with a material/layer (e.g., a conductive material/layer or an insulating material/layer) therein according to actual needs, and thus the flexibility of the manufacturing process and the function designs of the package structure 10 can be increased.

In addition, according to some embodiments of the present disclosure, the encapsulant 200 directly contacts the external surfaces of the outer lead portion 110, the inner lead portion 120, and the bridge portion 130 without any conductive coating layer, such as a metal finish layer or etch stop layer (e.g., PPF), formed there-between, and the inner lead portion 120 is connected to the bonding wire 500 through the conductive pad 160. Therefore, delamination caused by poor adhesion between the encapsulant 200 and the metal finish layer or etch stop layer (e.g., PPF) on the external surfaces of the lead frame 100 can be prevented, and thus the reliability of the package structure 10 can be improved.

In some embodiments, the conductive layer 140 is disposed on the surface 1102 of the outer lead portion 110. In some embodiments, the conductive layer 140 is disposed in a recess defined by the surface 1102 of the outer lead portion 110 and the encapsulant 200. In some embodiments, the conductive layer 140 has a surface 1402 exposed from the encapsulant 200 and a surface 1401 opposite to the surface 1402. In some embodiments, a portion of the conductive layer 140 is protruded from the surface 202 of the encapsulant 200. In some embodiments, a sidewall 1403 (also referred to as "a lateral surface") of the conductive layer 140 is in contact with the encapsulant 200. In some embodiments, the surface 202 of the encapsulant 200 is between the surface 1402 of the conductive layer 140 and the surface 1102 of the outer lead portion 110. In some embodiments, the conductive layer 140 includes a tin (Sn) layer. In some embodiments, the conductive layer 140 may be or include an electroplated tin layer. In some embodiments, the conductive layer 140 is free from a solder paste, a solder ball, or a solder bump. According to some embodiments of the present disclosure, the conductive layer 140 may serve to electrically connect the outer lead portion 110 to I/O terminals.

In some embodiments, the insulating coating layer 150 is on the surface 1202 of the inner lead portion 120. In some embodiments, the insulating coating layer 150 is disposed in a recess refined by the surface 1202 of the inner lead portion 120 and the encapsulant 200. In some embodiments, the insulating coating layer 150 has a surface 1501 facing the surface 1202 of the inner lead portion 120 and a surface 1502 opposite to the surface 1501. In some embodiments, the surface 1502 of the insulating coating layer 150 is substantially coplanar with or recessed from the surface 202 of the encapsulant 200. In some embodiments, the insulating coating layer 150 includes an insulating ink. According to some embodiments of the present disclosure, the insulating coating layer 150 covers the surface 1202 of the inner lead portion 120 and is substantially coplanar with or recessed from the surface 202 of the encapsulant 200. Therefore, the insulating coating layer 150 can prevent the inner lead portion 120 from undesirable shorting with other components, and the insulating coating layer 150 not protruding from the encapsulant 200 does not adversely affect the bonding of the package structure 10 to a substrate.

In some embodiments, the die paddle 300 has a surface 301 facing the semiconductor die 400 and a surface 302 opposite to the surface 301. In some embodiments, the surface 302 of the die paddle 300 is recessed from the surface 202 of the encapsulant 200. In some embodiments, the surface 302 of the die paddle 300 is substantially coplanar with the surface 1102 of the outer lead portion 110. In some embodiments, the surface 302 of the die paddle 300 is substantially coplanar with the surface 1202 of the inner lead portion 120.

In some embodiments, the conductive layer 210 is disposed on the surface 302 of the die paddle 300. In some embodiments, the conductive layer 210 is disposed in a recess defined by the surface 302 of the die paddle 300 and the encapsulant 200. In some embodiments, the conductive layer 210 has a surface 2101 facing the die paddle 300 and a surface 2102 opposite to the surface 2101. In some embodiments, the surface 2102 of the conductive layer 210 is protruded from the surface 202 of the encapsulant 200. In some embodiments, the conductive layer 210 is electrically connected to the die paddle 300. In some embodiments, the surface 2102 of the conductive layer 210 is substantially coplanar with the surface 1402 of the conductive layer 140. In some embodiments, the conductive layer 210 includes a tin (Sn) layer. In some embodiments, the conductive layer 210 may be or include an electroplated tin layer.

In some embodiments, the semiconductor die 400 is disposed on the surface 301 of the die paddle 300. In some embodiments, the semiconductor die 400 is electrically connected to the inner lead portion 120 through the bonding wire 500. In some embodiments, the semiconductor die 400 is adhered to the surface 301 of the die paddle 300 by the adhesive layer 600. The adhesive layer 600 may be or include a die attach film (DAF).

Figure 2B:
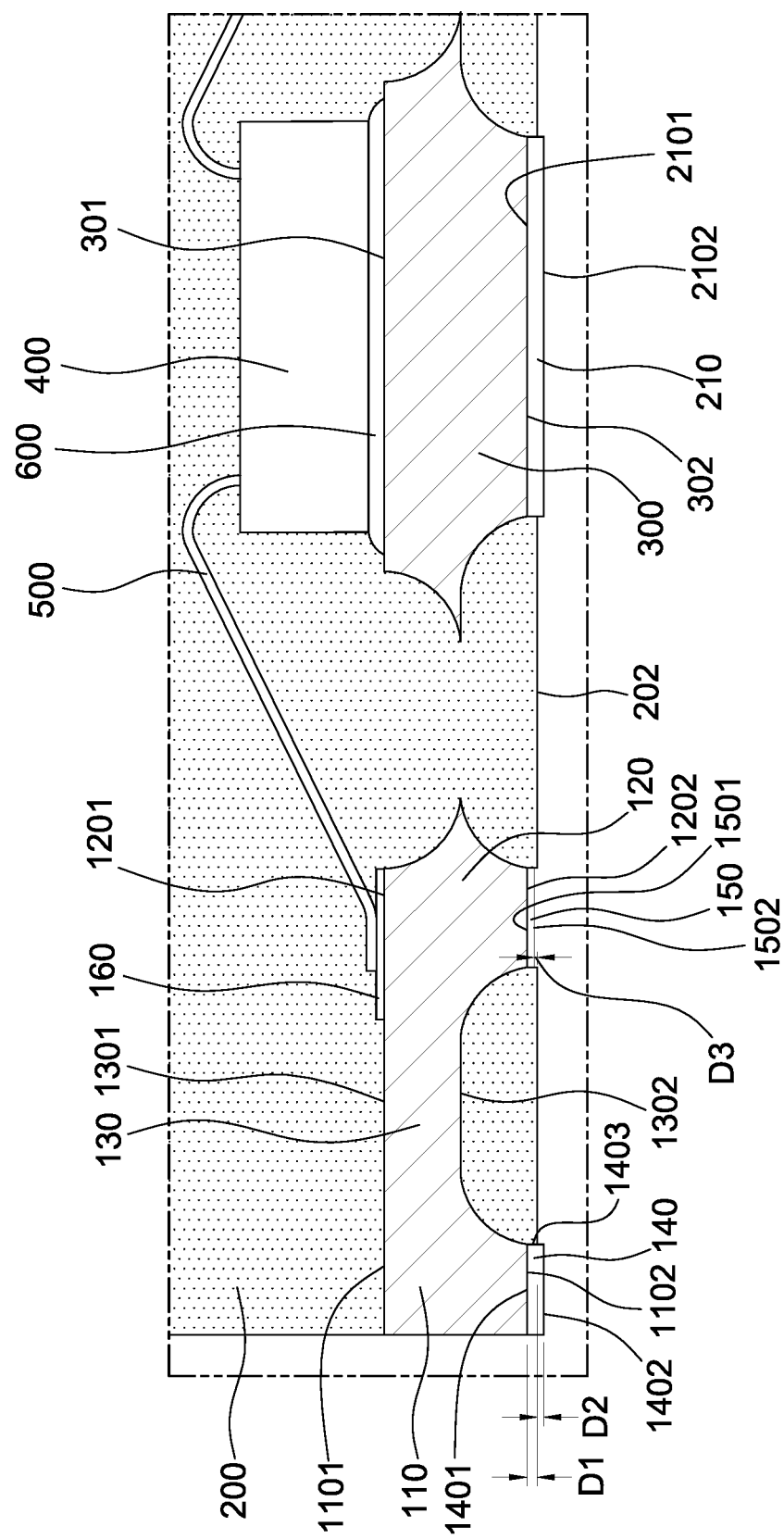
FIG. 2B illustrates an enlarged cross-sectional view of a portion of a package structure in accordance with some embodiments of the present disclosure.

FIG. 2B illustrates an enlarged cross-sectional view of a portion of a package structure 10 in accordance with some embodiments of the present disclosure. In some embodiments, FIG. 2B illustrates a cross-sectional view of the structure shown in the dashed box 2B in FIG. 2A.

In some embodiments, the surface 1102 of the outer lead portion 110 is recessed from the surface 202 of the encapsulant 200 by a distance D1. In some embodiments, the distance D1 is equal to or less than about 20 µm. In some embodiments, the distance D1 is equal to or less than about 15 µm.

In some embodiments, the surface 1402 of the conductive layer 140 is protruded from the surface 202 of the encapsulant 200 by a distance D2. In some embodiments, the distance D2 is equal to or less than about 10 µm. In some embodiments, the distance D2 is equal to or less than about 6 µm. In some embodiments, the distance D2 is equal to or less than about 2 µm.

According to some embodiments of the present disclosure, the external surface of the outer lead portion 110 is free from disposing a pre-plating frame finish (PPF) or a Ni/Pd/Au composite layer thereon, and the conductive layer 140 is disposed on the surface 1102 of the outer lead portion 110 and protruded from the encapsulant 200 by the aforesaid distance D2. Therefore, delamination caused by poor adhesion between the encapsulant 200 and the PPF or Ni/Pd/Au composite layer on the encapsulant 200 can be prevented, the conductive layer 140 can serve to electrically connect to I/O terminals, and the protruded conductive layer 140 is advantageous to bonding the package structure 10 to a substrate.

In some embodiments, the surface 1502 of the insulating coating layer 150 and the surface 202 of the encapsulant 200 are at different elevations. In some embodiments, the surface 1502 of the insulating coating layer 150 is recessed from the surface 202 of the encapsulant 200. In some embodiments, the surface 1502 of the insulating coating layer 150 is recessed from the surface 202 of the encapsulant 200 by a distance D3 that is equal to or less than about 15 µm. In some embodiments, the distance D3 is equal to or less than about 10 µm. In some embodiments, the distance D3 is equal to or less than about 5 µm. In some embodiments, the distance D3 is equal to or less than about 2 µm.

Figure 3A:
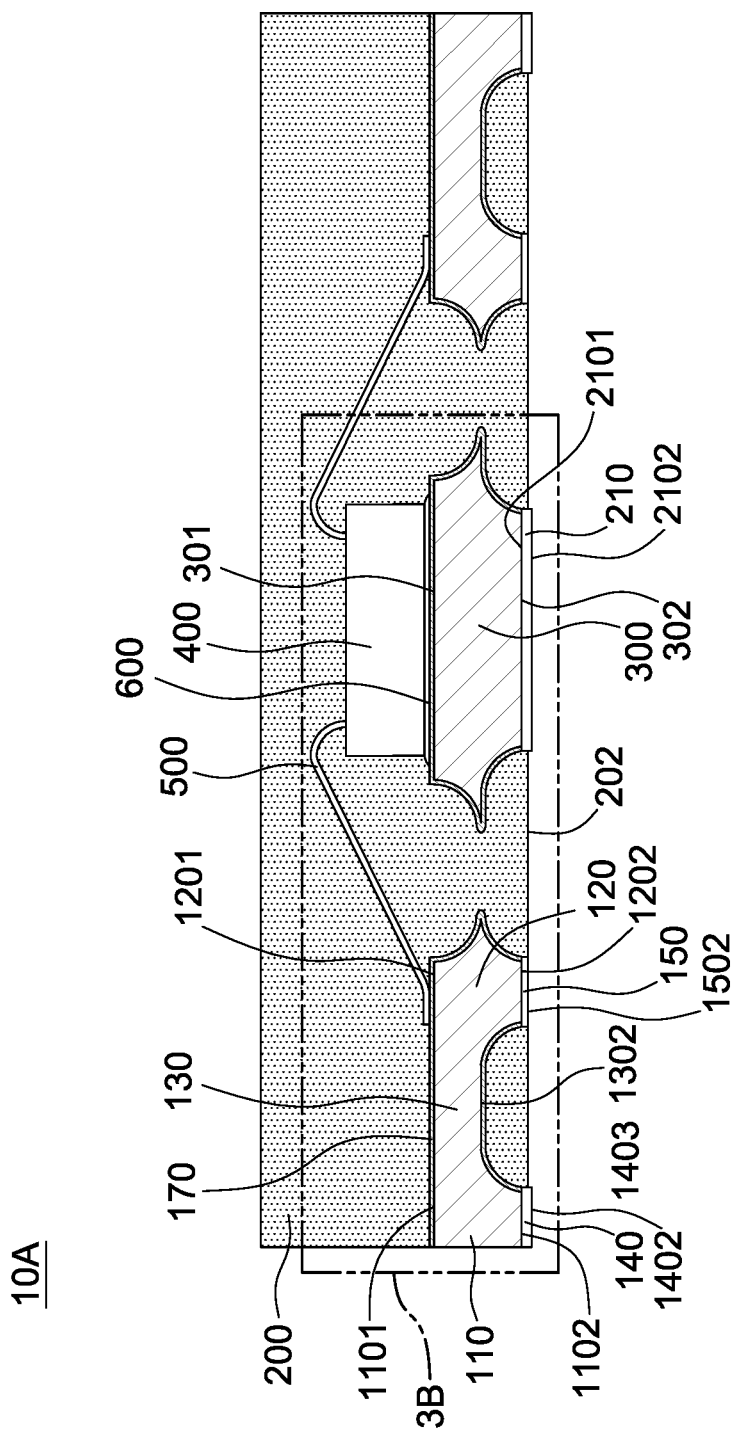
FIG. 3A illustrates a cross-sectional view of a package structure in accordance with some embodiments of the present disclosure.

FIG. 3A illustrates a cross-sectional view of a package structure 10A in accordance with some embodiments of the present disclosure. The package structure 10A is similar to the package structure 10 in FIG. 2A except that, for example, the package structure 10A includes a conductive coating layer 170.

In some embodiments, the conductive coating layer 170 covers the surface 1101 of the outer lead portion 110 and the surface 1201 of the inner lead portion 120. In some embodiments, the conductive coating layer 170 exposes the surface 1102 of the outer lead portion 110. In some embodiments, the conductive coating layer 170 exposes the surface 1202 of the inner lead portion 120. In some embodiments, the bonding wire 500 directly contacts the conductive coating layer 170 on the surface 1201 of the inner lead portion 120. In some embodiments, the conductive coating layer 170 may replace the conductive pad 160 illustrated in FIGS. 2A-2B and serve to electrically connect to the bonding wire 500.

In some embodiments, the conductive coating layer 170 covers the surface 301 of the die paddle 300 and exposes the surface 302 of the die paddle 300. In some embodiments, the conductive coating layer 170 may be a metal finish layer or an etch stop layer. The metal finish layer or the etch stop layer may be or include a pre-plating frame finish (PPF) or a Ni/Pd/Au composite layer.

Figure 3B:
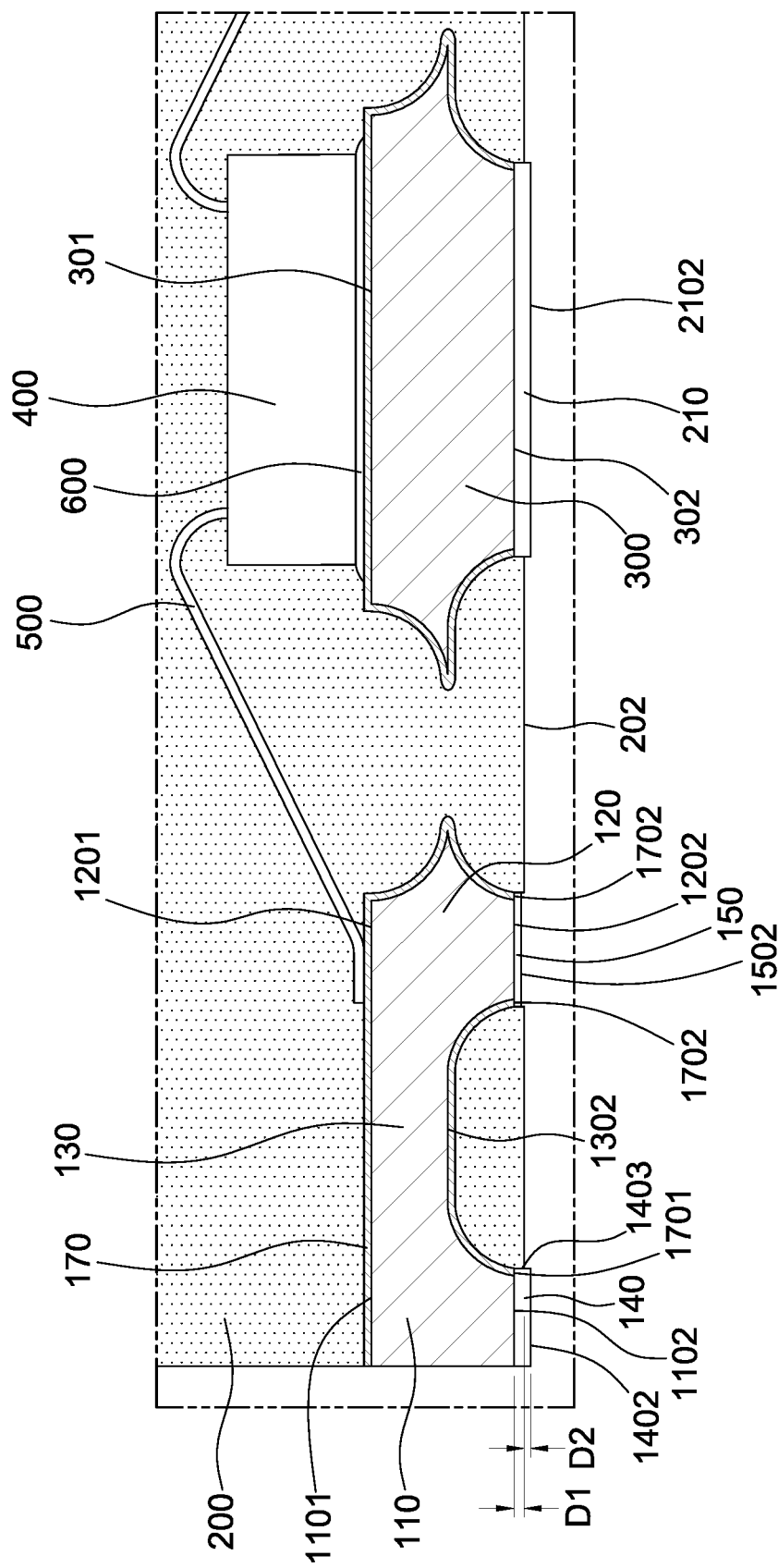
FIG. 3B illustrates an enlarged cross-sectional view of a portion of a package structure in accordance with some embodiments of the present disclosure.

FIG. 3B illustrates an enlarged cross-sectional view of a portion of a package structure 10A in accordance with some embodiments of the present disclosure. In some embodiments, FIG. 3B illustrates a cross-sectional view of the structure shown in the dashed box 3B in FIG. 3A.

In some embodiments, the surface 1502 of the insulating coating layer 150 and the surface 202 of the encapsulant 200 are at different elevations. In some embodiments, the surface 1502 of the insulating coating layer 150 is recessed from the surface 202 of the encapsulant 200.

In some embodiments, a portion of the conductive coating layer 170 on the outer lead portion 110 has a surface 1701 contacting the conductive layer 140. In some embodiments, the surface 1701 of the conductive coating layer 170 is substantially coplanar with the surface 1102 of the outer lead portion 110. In some embodiments, a portion of the conductive coating layer 170 on the inner lead portion 120 has a surface 1702 contacting the insulating coating layer 150. In some embodiments, the surface 1702 of the conductive coating layer 170 is substantially coplanar with the surface 1202 of the inner lead portion 110. In some other embodiments, the surface 1701 and the 1702 may be substantially coplanar with the surface 202 of the encapsulant 200 (not shown in FIG. 3B).

Figure 4A:
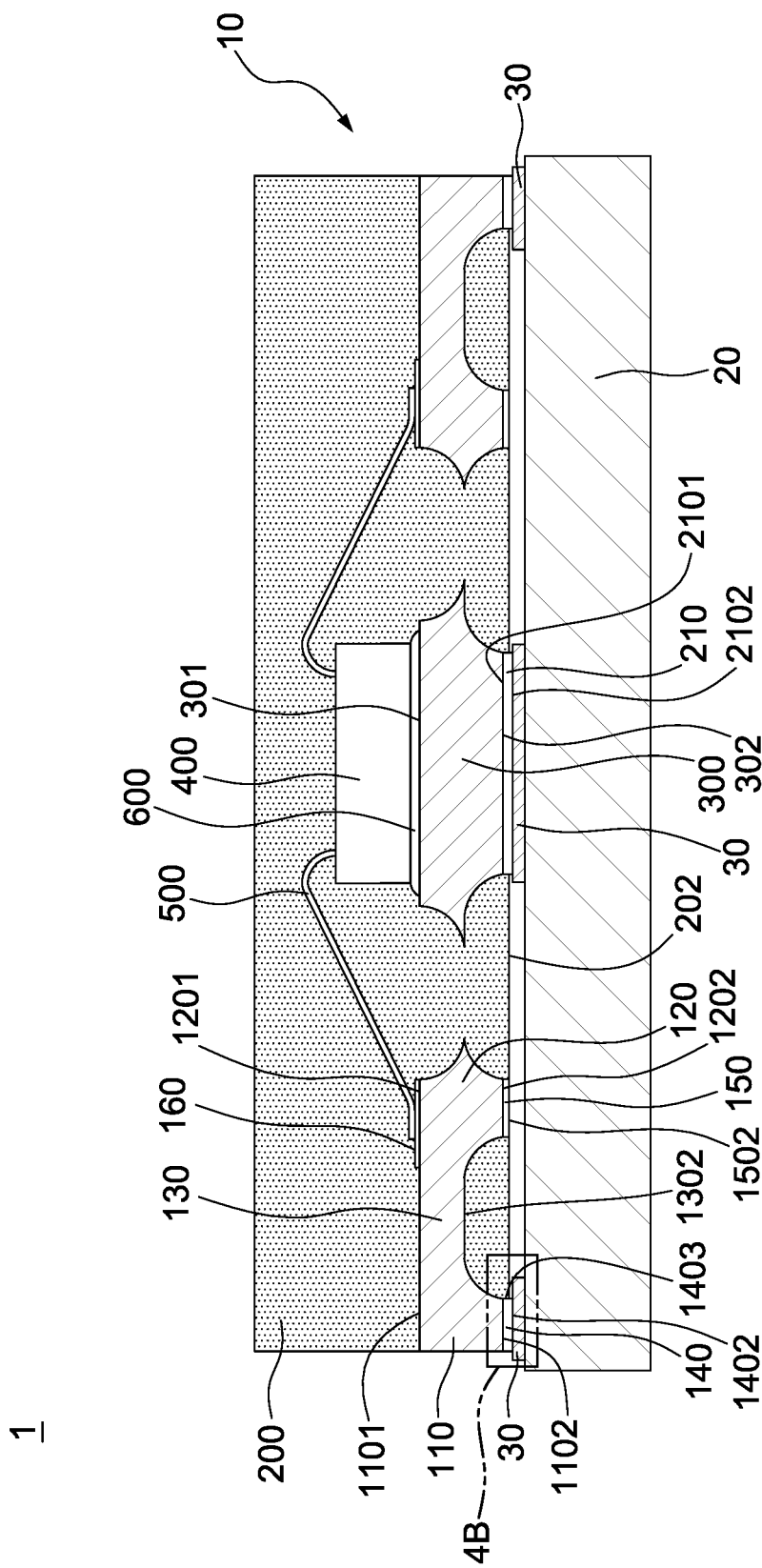
FIG. 4A illustrates a cross-sectional view of an electronic device in accordance with some embodiments of the present disclosure.

FIG. 4A illustrates a cross-sectional view of an electronic device 1 in accordance with some embodiments of the present disclosure. The electronic device 1 includes a substrate 20, a package structure 10, and conductive bumps 30. In some embodiments, the package structure 10 may be or include a structure similar to that of the package structure 10 illustrated in FIG. 1A, the package structure 10 illustrated in FIG. 1B, the package structure 10 illustrated in FIG. 2A, the package structure 10 illustrated in FIG. 2B, the package structure 10A illustrated in FIG. 3A, or the package structure 10A illustrated in FIG. 3B.

The substrate 20 may include, for example, a printed circuit board, such as a paper-based copper foil laminate, a composite copper foil laminate, or a polymer-impregnated glass-fiber-based copper foil laminate. The substrate 20 may include an interconnection structure, such as a redistribution layer (RDL) or a grounding element.

In some embodiments, the conductive bumps 30 are disposed between the substrate 20 and the package structure 10. In some embodiments, the first conductive layer 140 is in contact with at least one of the conductive bumps 30 and forming an electrical connection between the substrate 20 and the package structure 10. In some embodiments, the conductive bumps 30 may be or may include gold (Au), silver (Ag), copper (Cu), another metal, a solder alloy, or a combination of two or more thereof. In some embodiments, the conductive layer 140 includes a tin layer, and the conductive bumps 30 include SnAgCu.

In some embodiments, the insulating coating layer 150 is on the surface 1202 of the inner lead portion 120 and spaced apart from the substrate 20. In some embodiments, the conductive layer 210 electrically connects at least one of the conductive bumps 30 to the die paddle 300. In some embodiments, the first conductive layer 210 is in contact with at least one of the conductive bumps 30 and forming an electrical connection between the substrate 20 and the package structure 10.

Figure 4B:
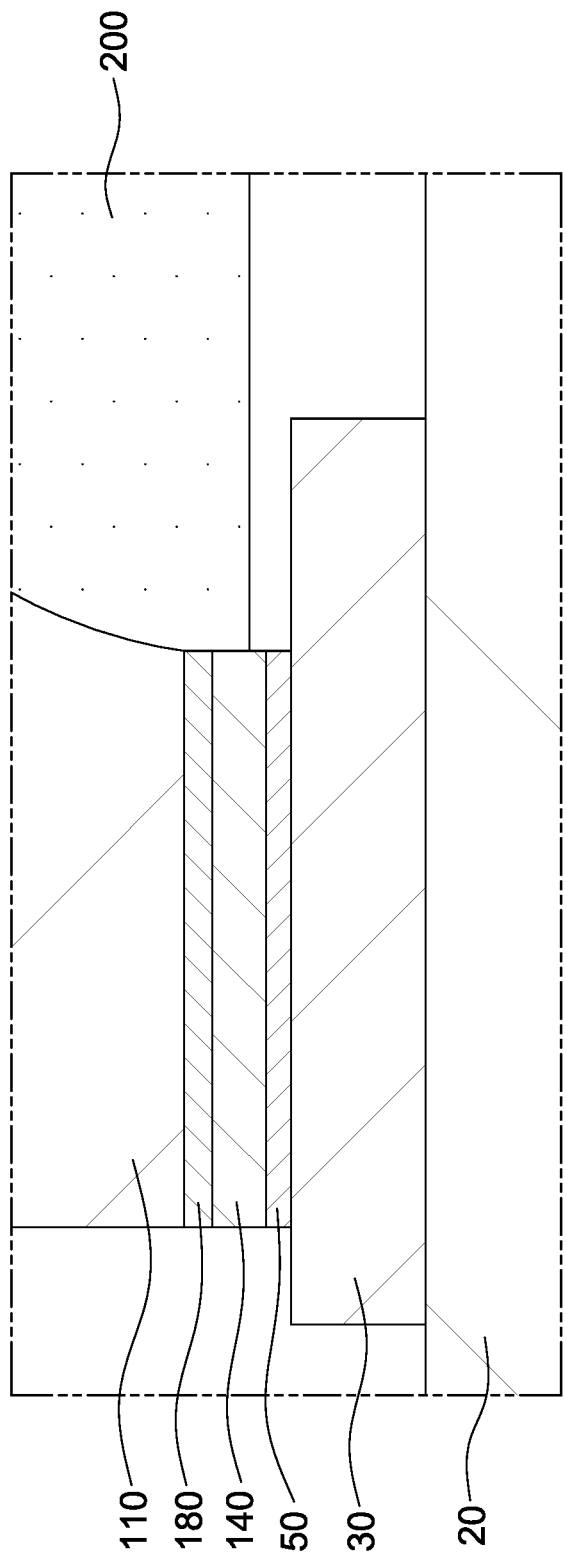
FIG. 4B illustrates an enlarged cross-sectional view of a portion of an electronic device in accordance with some embodiments of the present disclosure.

FIG. 4B illustrates an enlarged cross-sectional view of a portion of an electronic device 1 in accordance with some embodiments of the present disclosure. In some embodiments, FIG. 4B illustrates a cross-sectional view of the structure shown in the dashed box 4B in FIG. 4A.

In some embodiments, the package structure 10 further includes an intermetallic layer 180 between the outer lead portion 110 and the conductive layer 140. In some embodiments, the intermetallic layer 180 includes an intermetallic compound formed from at least one element from the outer lead portion 110 and at least one element from the conductive layer 140. In some embodiments, the intermetallic layer 180 includes $Cu_3Sn$, $Cu_6Sn_5$, or a combination thereof.

In some embodiments, the electronic device 1 further includes an intermetallic layer 50 between the conductive layer 140 and one of the conductive bumps 30. In some embodiments, the intermetallic layer 50 includes an intermetallic compound formed from at least one element from the conductive bumps 30 and at least one element from the conductive layer 140. In some embodiments, the intermetallic layer 50 includes $Cu_3Sn$, $Cu_6Sn_5$, or a combination thereof.

FIG. 5A, FIG. 5B, FIG. 5C, FIG. 5D, FIG. 5E, FIG. 5F, FIG. 5G and FIG. 5H illustrate various operations in a method of manufacturing a package structure 10 in accordance with some embodiments of the present disclosure.

Figure 5A:
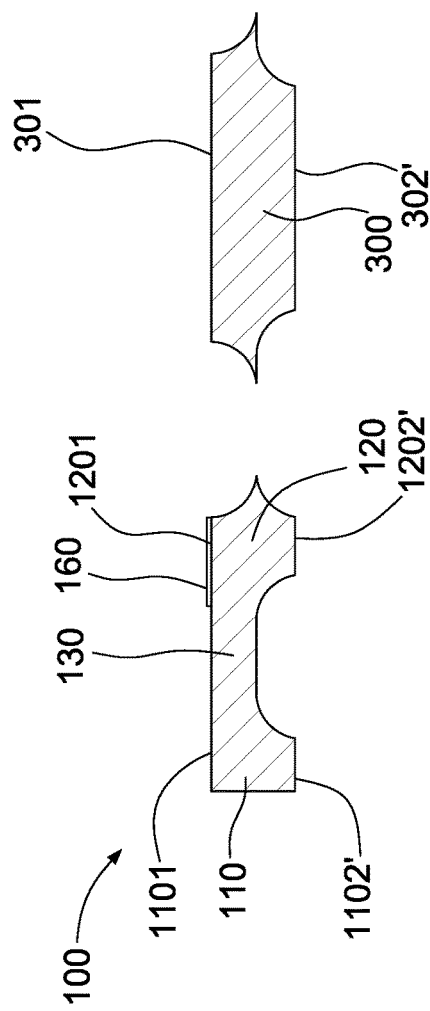

Referring to FIG. 5A, a lead frame 100 including an outer lead portion 110 and an inner lead portion 120 connected to the outer lead portion 110 is provided, and a conductive pad 160 is formed on a surface 1201 of the inner lead portion 120. The conductive pad 160 may be formed by plating. In some embodiments, the lead frame 100 further includes a bridge portion 130 connecting the outer lead portion 110 and the inner lead portion 120. In some embodiments, the lead frame 100 further includes a die paddle 300.

In some embodiments, the external surfaces of the lead frame 100 may be fully covered by a conductive coating layer (e.g., the conductive coating layer 170 illustrated in FIGS. 3A-3B, not shown in FIG. 5A). The lead frame 100 of FIG. 5A described herein may be commercially available.

Figure 5B:
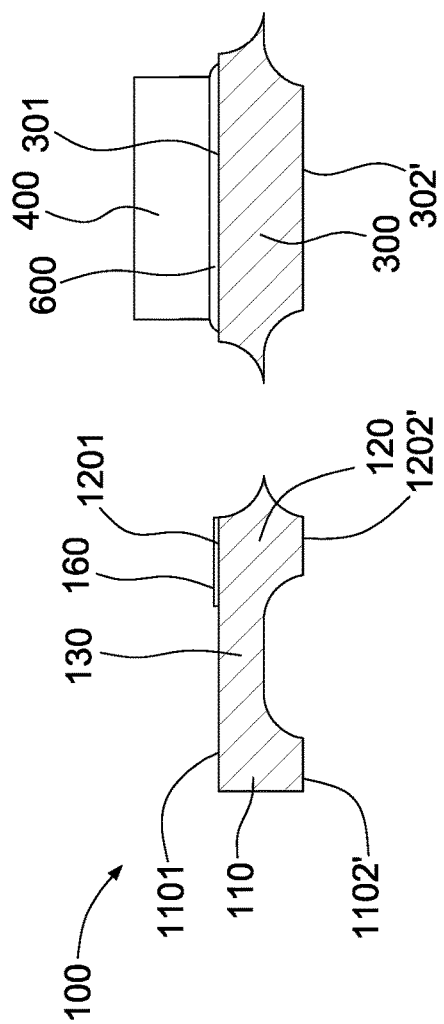

Referring to FIG. 5B, a semiconductor die 400 is disposed on a surface 301 of the die paddle 300. In some embodiments, the semiconductor die 400 is adhered to the surface 301 of the die paddle 300 by an adhesive layer 600.

Referring to FIG. 5C, the semiconductor die 400 is wire-bonded to the inner lead portion 120. In some embodiments, the semiconductor die 400 is bonded to the conductive pad 160 on the inner lead portion 120 by a bonding wire 500. During the wire bonding operation illustrated in FIG. 5C, the location where the bond head landed on inner lead portion 120 is mechanically supported by the body of the inner lead portion 120, which may possess a thickness substantially identical to that of the outer lead portion 110 and greater than the bridge portion 130.

Referring to FIG. 5D, the outer lead portion 110 and the inner lead portion 120 are encapsulated by an encapsulant 200. In some embodiments, the semiconductor die 400 is disposed on the surface 301 of the die paddle 300 prior to encapsulating the outer lead portion 110 and the inner lead portion 120 by the encapsulant 200.

In some embodiments, the encapsulating operation may include the following operations: disposing the outer lead portion 110, the inner lead portion 120, the die paddle 300, the semiconductor die 400, and the bonding wire 500 on a carrier (not shown) with the surface 1102' of the outer lead portion 110, the surface 1202' of the inner lead portion 120, and the surface 302' of the die paddle 300 contacting the carrier; encapsulating the outer lead portion 110, the inner lead portion 120, the die paddle 300, the semiconductor die 400, and the bonding wire 500 by the encapsulant 200 to fully cover the outer lead portion 110, the inner lead portion 120, the die paddle 300, the semiconductor die 400, and the bonding wire 500; and removing the carrier to expose the surface 1102' of the outer lead portion 110, the surface 1202' of the inner lead portion 120, the surface 302' of the die paddle 300, and a surface 202 of the encapsulant 200. In some embodiments, the carrier may be a tape. As shown in FIG. 5D, the carrier or the tape has been removed after the encapsulation. The carrier or the tape serves the purpose of preventing the molding materials from contaminating the surface 1102' of the outer lead portion 110 and the surface 1202' of the inner lead portion 120.

Figure 5E:
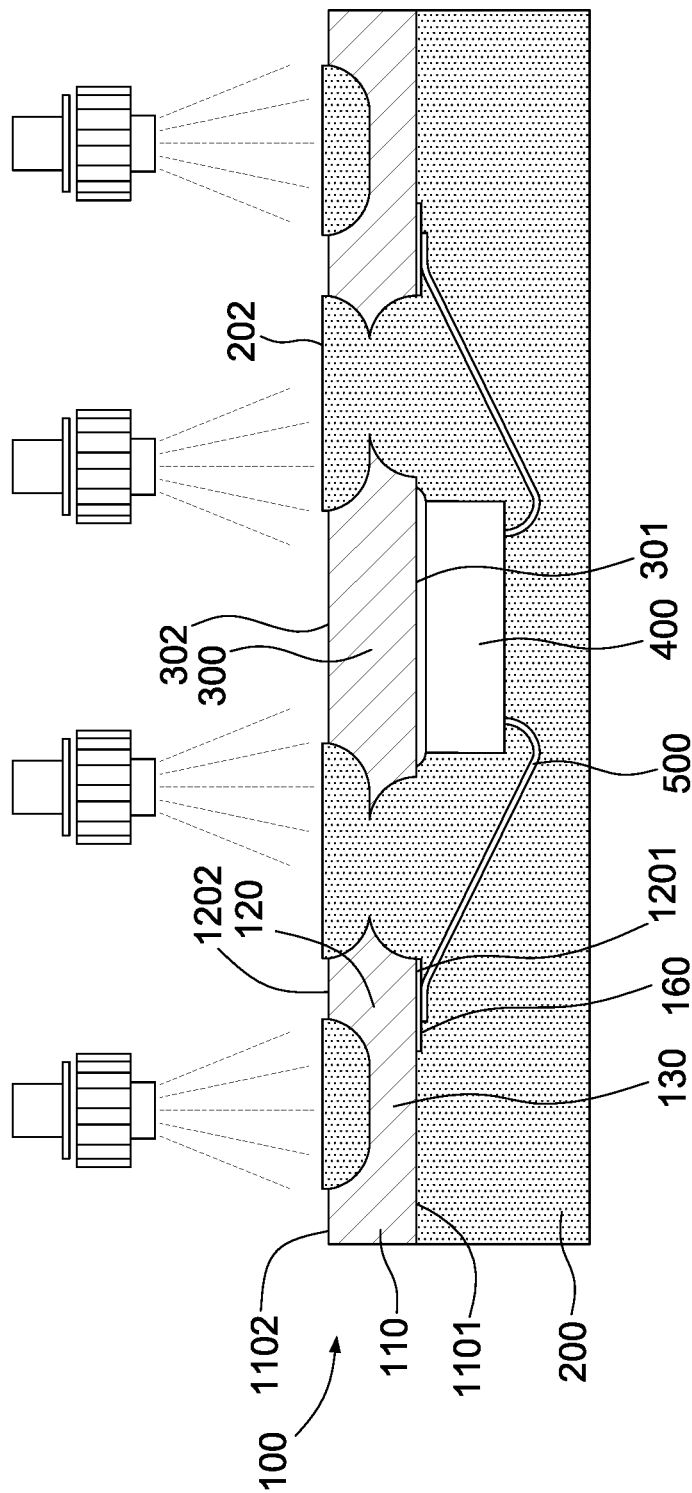

Referring to FIG. 5E, the surface 1102' of the outer lead portion 110 and the surface 1202' of the inner lead portion 120 previously shown in FIG. 5D are etched in a single operation, so as to form an etched surface 1102 of the outer lead portion 110 and an etched surface 1202 of the inner lead portion 120 that are recessed from the surface 202 of the encapsulant 200. In some embodiments, the etched surface 1102 of the outer lead portion 110 and the etched surface 1202 of the inner lead portion 120 are substantially coplanar after the etching operation. In some embodiments, etching operation includes a wet etching process suitable for removing conductive material such as copper. In some embodiments, the surface 1102' of the outer lead portion 110 and the surface 1202' of the inner lead portion 120 are removed by a thickness about tens of micrometers, for example, less than 50 μm, or less than 20 μm. Compared to a conventional half-etching approach where over 100 μm or equivalent to one-half of the thickness of the inner lead portion is removed, present disclosure provides an etching operation to a less extent.

In some embodiments, the surface 302' of the die paddle 300 previously shown in FIG. 5D is etched so as to form an etched surface 302 of the die paddle 300 that is recessed from the surface 202 of the encapsulant 200. In some embodiments, the surface 302' of the die paddle 300 is etched in the single operation for etching the surface 1102' of the outer lead portion 110 and the surface 1202' of the inner lead portion 120, so as to form the etched surface 302 of the die paddle 300.

In some embodiments, the surface 1102' of the outer lead portion 110 and the surface 1202' of the inner lead portion 120 are etched by a chlorine-based etchant. In some embodiments, the chlorine-based etchant includes $FeCl$, $CuCl_2$, or a combination thereof. In some embodiments, the surface 1102' of the outer lead portion 110, the surface 1202' of the inner lead portion 120, and the surface 302' of the die paddle 300 are etched by a chlorine-based etchant in a single operation.

In some other embodiments, the external surfaces of the lead frame 100 may be fully covered by a conductive coating layer (e.g., the conductive coating layer 170 shown in FIGS. 3A-3B), and a polishing process may be performed to remove portions of the conductive coating layer to expose the surface 1102' of the outer lead portion 110, the surface 1202' of the inner lead portion 120, and the surface 302' of the die paddle 300 prior to the aforesaid etching operation. In some embodiments, a portion of the encapsulant 200 may be removed by the same polishing process for removing portions of the conductive coating layer.

Figure 5F:
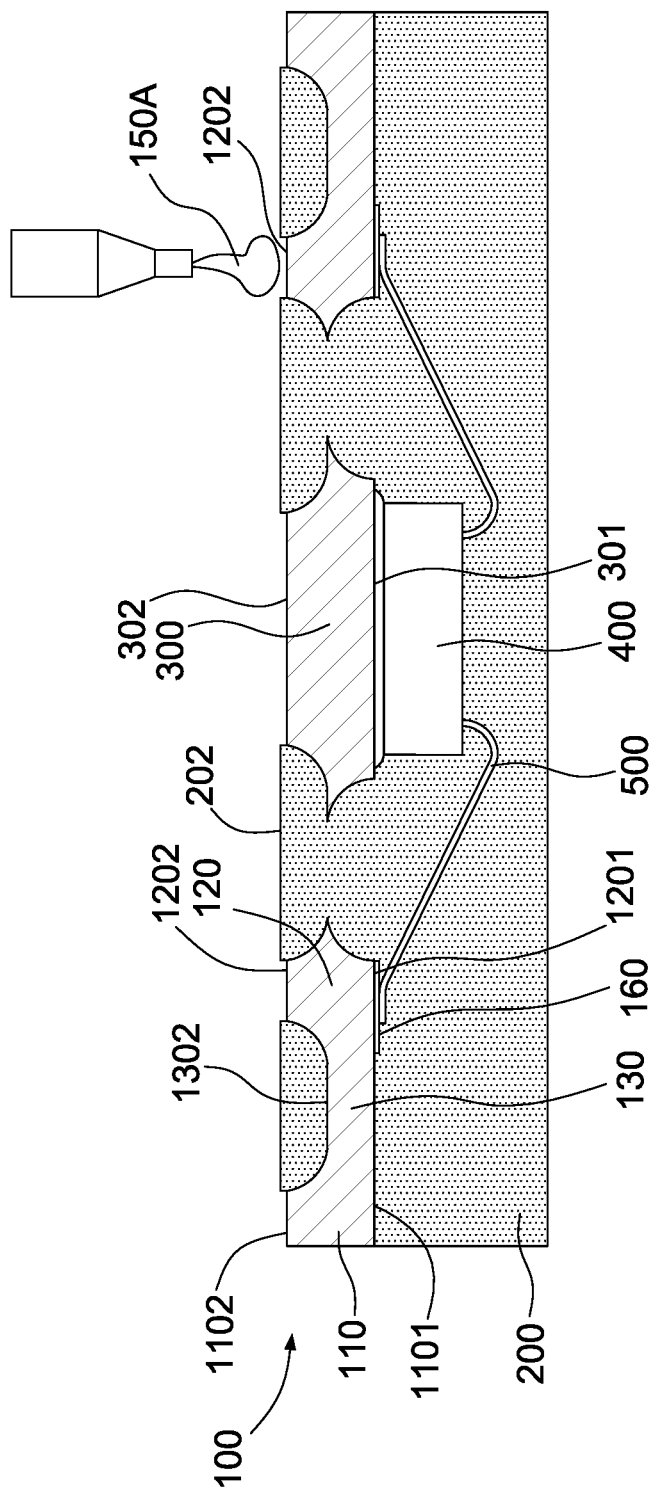
Figure 5G:
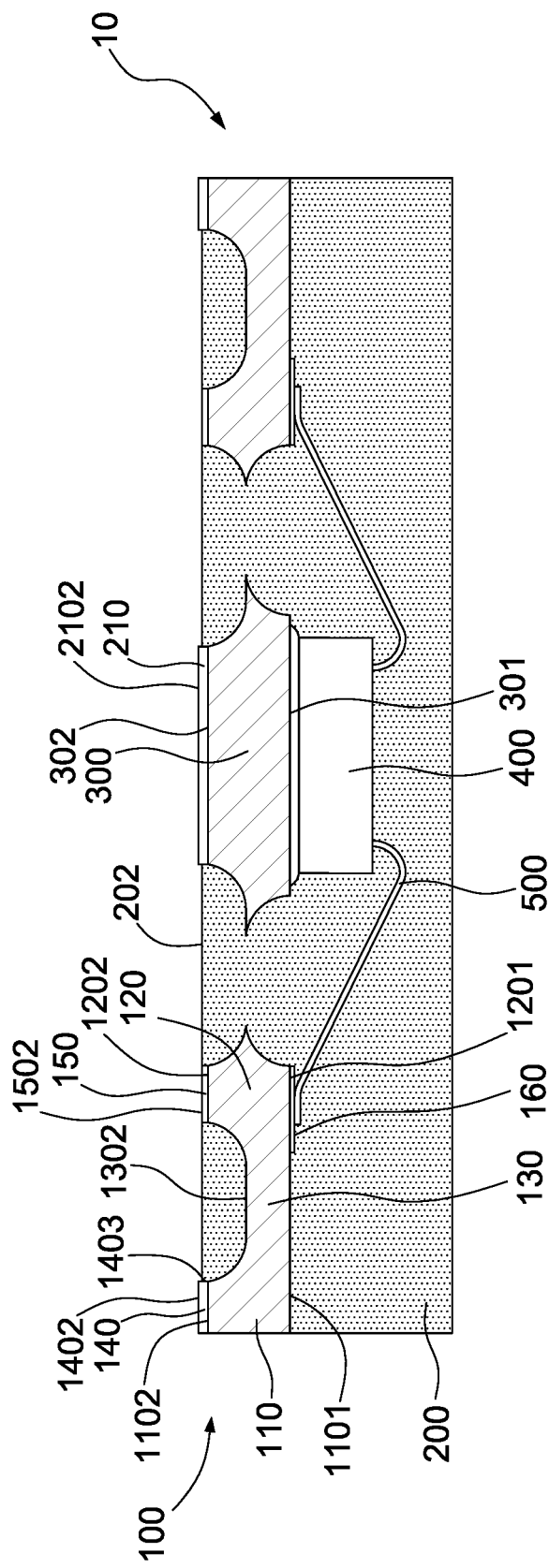

Referring to FIG. 5F, an insulating material 150A is applied on the etched surface 1202 of the inner lead portion 120 to form an insulating coating layer 150 (shown in FIG. 5G). In some embodiments, a surface 1502 of the insulating coating layer 150 is substantially coplanar with or recessed from the surface 202 of the encapsulant 200. In some embodiments, the insulating material 150A may be applied by a coating process.

Referring to FIG. 5G, a conductive layer 140 is formed on the etched surface 1102 of the outer lead portion 110. In some embodiments, the conductive layer 140 may be formed by a plating process. In some embodiments, the insulating coating layer 150 may serve as a mask layer in the plating process for forming the conductive layer 140, so that the conductive layer 140 is only formed on the surface 1101 of the outer lead portion 110 exposed from the encapsulant 200 and the insulating coating layer 150. In some embodiments, the conductive layer 140 is formed after forming the insulating coating layer 150. In some embodiments, a surface 1402 of the conductive layer 140 is protruded from the surface 202 of the encapsulant 200. As such, a package structure 10 as illustrated in FIG. 1A is formed.

Figure 5H:
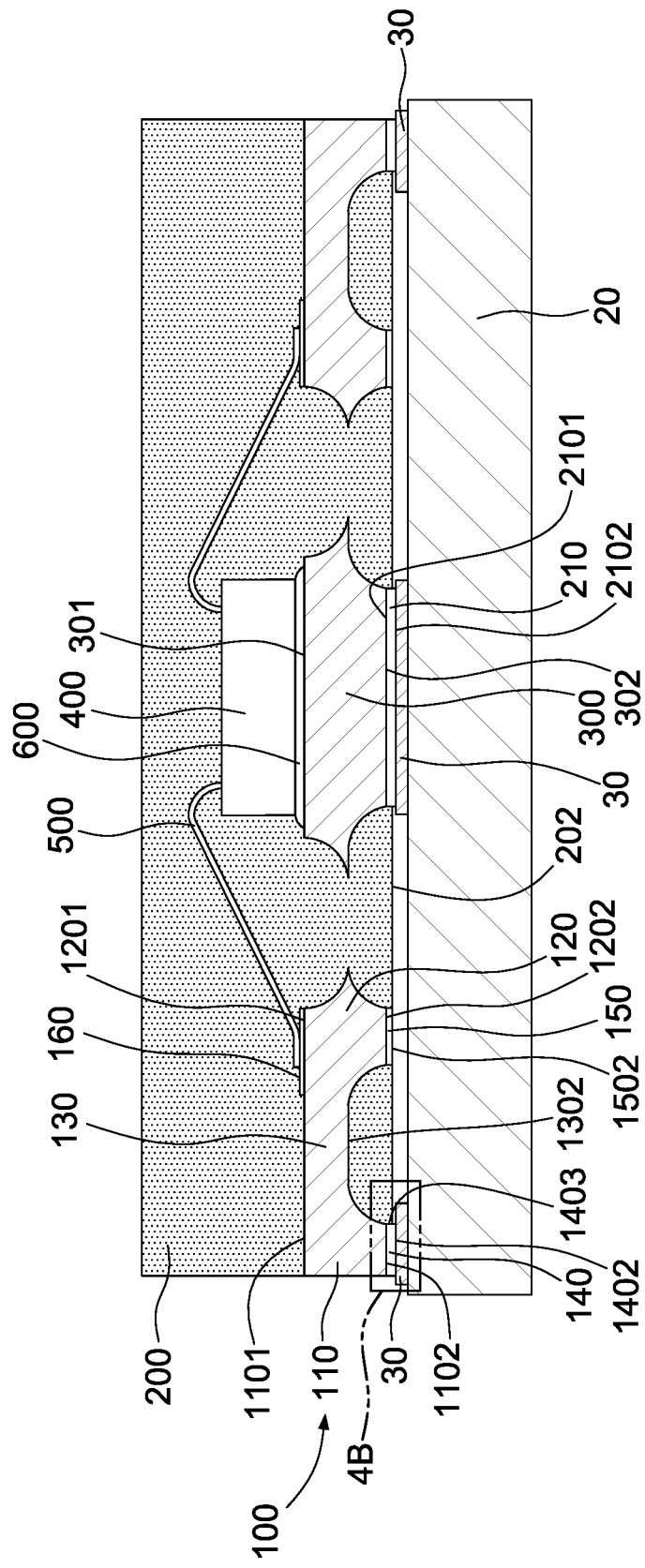

Referring to FIG. 5H, the package structure 10 shown in FIG. 5G is bonded to a substrate 20. In some embodiments, the package structure 10 may be bonded to the substrate 20 by the following operations: forming conductive bumps 30 on the substrate 20, and bonding the conductive layers 140 and 210 to the conductive bumps 30. As such, an electronic device 1 as illustrated in FIGS. 4A-4B is formed.

In some other embodiments, as aforementioned, instead of providing the lead frame 100 including with the conductive pad 160 formed on the inner lead portion 120, a lead frame including an outer lead portion 110, an inner lead portion 120 and a bridge portion 130 substantially fully coated with a conductive coating layer (e.g., the conductive coating layer 170 shown in FIGS. 3A-3B) on external surfaces thereof is provided. In some embodiments, the lead frame may include a die paddle 300 substantially fully coated with a conductive coating layer (e.g., the conductive coating layer 170 shown in FIGS. 3A-3B) on external surfaces of the die paddle 300. Next, operations similar to those illustrated in FIGS. 5B-5H are performed, except that a polishing process is performed to remove portions of the conductive coating layer to expose the surface 1102' of the outer lead portion 110, the surface 1202' of the inner lead portion 120, and the surface 302' of the die paddle 300 prior to the etching operation as illustrated in FIG. 5D, and then an electronic device including a package structure 10A shown in FIGS. 3A-3B is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:
1. A package structure, comprising:
a lead consisting of an outer lead portion and an inner lead portion, wherein the outer lead portion has a top surface and a bottom surface opposite to the top surface, the inner lead portion having a top surface and a bottom surface opposite to the top surface;
an encapsulant covering the top surface of the outer lead portion and the top surface of the inner lead portion, wherein an elevation of the bottom surface of the outer lead portion is lower than any part of the inner lead portion; and
an insulating coating layer on the bottom surface of the inner lead portion, wherein an elevation of a bottom surface of the insulating coating layer is higher than an elevation of a bottommost surface of the encapsulant.

2. The package structure of claim 1, wherein the outer lead portion comprises a conductive layer, and the conductive layer comprises a first portion embedded in the encapsulant and a second portion protruded beyond the encapsulant.

3. The package structure of claim 2, wherein the outer lead portion further comprises a lead part having a bottom surface in contact with the conductive layer, the bottom surface of the lead part and the bottom surface of the inner lead portion are at substantially the same elevation, and the conductive layer is spaced apart from the bottom surface of the inner lead portion.

4. The package structure of claim 1, wherein the outer lead portion comprises a conductive layer and a lead part having a bottom surface in contact with the conductive layer, and an elevation of a bottommost surface of the encapsulant is between an elevation of the bottom surface of the lead part and a bottommost surface of the conductive layer.

5. The package structure of claim 4, wherein the conductive layer comprises a first portion embedded in the encapsulant and a second portion protruded beyond the encapsulant, the first portion of the conductive layer has a first thickness, and the second portion of the conductive layer has a second thickness less than the first thickness.

6. The package structure of claim 1, further comprising:
a die paddle spaced apart from the inner lead portion; and
a first conductive layer disposed on the die paddle, the first conductive layer comprising a first portion embedded in the encapsulant and a second portion protruded beyond the encapsulant.

7. The package structure of claim 6, wherein the first conductive layer is spaced apart from the bottom surface of the inner lead portion.

8. The package structure of claim 6, wherein the outer lead portion comprises a second conductive layer and a lead part having a bottom surface in contact with the second conductive layer, and an elevation of a bottommost surface of the encapsulant is between an elevation of the bottom surface of the lead part and a bottommost surface of the second conductive layer.

9. A package structure, comprising:
a lead consisting of an outer lead portion and an inner lead portion, wherein the outer lead portion has a top surface and a bottom surface opposite to the top surface, the inner lead portion having a top surface and a bottom surface opposite to the top surface;
an encapsulant covering the top surface of the outer lead portion and the top surface of the inner lead portion, wherein an elevation of the bottom surface of the outer lead portion is lower than any part of the inner lead portion, wherein the outer lead portion comprises a first conductive layer and a lead part having a bottom surface in contact with the first conductive layer, the first conductive layer comprises a first portion embedded in the encapsulant and a second portion protruded beyond the encapsulant, and an elevation of a bottommost surface of the encapsulant is between an elevation of the bottom surface of the lead part and a bottommost surface of the first conductive layer;
a die paddle spaced apart from the inner lead portion;
a second conductive layer disposed on the die paddle, the second conductive layer comprising a first portion embedded in the encapsulant and a second portion protruded beyond the encapsulant; and
an insulating coating layer on the bottom surface of the inner lead portion, wherein an elevation of a bottom surface of the insulating coating layer is higher than the elevation of the bottommost surface of the encapsulant.

10. A package structure, comprising:
an outer lead portion having a top surface and a bottom surface opposite to the top surface;
an inner lead portion connected to the outer lead portion, the inner lead portion having a top surface and a bottom surface opposite to the top surface;
an encapsulant covering the top surface of the outer lead portion and the top surface of the inner lead portion;
a first conductive layer disposed on the bottom surface of the outer lead portion; and
an insulating coating layer on the bottom surface of the inner lead portion and contacting the encapsulant.

11. The package structure of claim 10, wherein the insulating coating layer has a first surface contacting the bottom surface of the inner lead portion and a lateral surface angled with the first surface and contacting the encapsulant.

12. The package structure of claim 11, wherein the insulating coating layer has a second surface opposite to the first surface and recessed from a bottom surface of the encapsulant.

13. The package structure of claim 10, wherein a thickness of the insulating coating layer is less than a thickness of the first conductive layer.

14. The package structure of claim 10, wherein the inner lead portion further has a lateral surface extending between the top surface and the bottom surface, and the package structure further comprises a conductive coating layer covering the top surface and the lateral surface of the inner lead portion.

15. The package structure of claim 14, wherein the conductive coating layer is embedded in the encapsulant and contacting the first conductive layer.

16. The package structure of claim 14, further comprising a bridge portion connecting the inner lead portion and the outer lead portion, wherein the conductive coating layer covers the bridge portion.

17. The package structure of claim 14, further comprising a die paddle spaced apart from the inner lead portion, wherein the conductive coating layer further covers the die paddle.

18. The package structure of claim 10, wherein
the insulating coating layer has a first surface contacting the bottom surface of the inner lead portion and a lateral surface angled with the first surface and contacting the encapsulant,
a thickness of the insulating coating layer is less than a thickness of the first conductive layer,
the inner lead portion further has a lateral surface extending between the top surface and the bottom surface, and
the package structure further comprises a conductive coating layer covering the top surface and the lateral surface of the inner lead portion.

* * * * *